United States Patent
Green

(10) Patent No.: US 6,858,996 B2
(45) Date of Patent: Feb. 22, 2005

(54) DRIVER IC FOR USE WITH SIMPLE MICROCONTROL

(75) Inventor: Peter Green, Redondo Beach, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/618,487

(22) Filed: Jul. 11, 2003

(65) Prior Publication Data

US 2004/0032288 A1 Feb. 19, 2004

Related U.S. Application Data

(60) Provisional application No. 60/403,731, filed on Aug. 14, 2002.

(51) Int. Cl.[7] .......................... H05B 37/02; H02M 3/335
(52) U.S. Cl. ................... 315/291; 315/307; 315/209 R; 363/24; 363/56.2
(58) Field of Search ................................. 315/291, 300, 315/307, 313, 362, 209 R, 224; 363/24, 56.02, 132, 134, 147; H05B 37/02; H02M 3/335

(56) References Cited

U.S. PATENT DOCUMENTS

| | | | |
|---|---|---|---|
| 4,685,040 A | * | 8/1987 | Steigerwald et al. .......... 363/17 |
| 5,510,974 A | * | 4/1996 | Gu et al. ..................... 363/134 |
| 5,563,536 A | | 10/1996 | Hosl et al. ................... 327/108 |
| 5,598,326 A | * | 1/1997 | Liu et al. ....................... 363/34 |
| 6,031,736 A | * | 2/2000 | Takehara et al. .............. 363/98 |
| 6,281,641 B1 | | 8/2001 | Chen et al. .................. 315/307 |
| 6,285,138 B1 | | 9/2001 | Kataoka et al. ............. 315/291 |
| 6,541,926 B1 | * | 4/2003 | Forghieri .................... 315/307 |
| 6,552,606 B1 | | 4/2003 | Veltman et al. ............... 330/10 |
| 6,617,757 B2 | * | 9/2003 | Vazquez Carazo et al. . 310/317 |

* cited by examiner

*Primary Examiner*—Don Wong
*Assistant Examiner*—Trinh Vo Dinh
(74) *Attorney, Agent, or Firm*—Ostrolenk, Faber, Gerb & Soffen, LLP

(57) ABSTRACT

A driver circuit for driving a switching circuit driving a load, e.g., a gas discharge lamp, the drive circuit comprising an input trigger circuit receiving a pulsed input signal for controlling the generation of two drive signals, a first drive signal driving a high side switch of a half bridge switching circuit and a second drive signal driving a low side switch of the half bridge switching circuit, a circuit for providing a dead time between the first and second drive signals whereby both the first and second drive signals are substantially zero, the input trigger circuit generating a control signal for controlling the generation of the first and second drive signals based on a characteristic of the pulsed input signal and first and second drive circuits for providing the first and second drive signals.

25 Claims, 3 Drawing Sheets

DRIVER IC FOR USE WITH SIMPLE MICROCONTROL

CROSS REFERENCE TO RELATED APPLICATIONS

The present application claims the priority and benefit of U.S. Provisional patent application No. 60/403,731 filed Aug. 14, 2002 entitled BALLAST DRIVER IC FOR USE WITH SIMPLE MICROCONTROL, the entire disclosure of which is hereby incorporated by reference.

BACKGROUND OF THE INVENTION

Present lighting ballast applications typically use a half bridge driver for controlling power delivery to a gas discharge lamp. For example, a high side switch 10 and low side switch 15, as shown in FIG. 3, may be used in the half bridge configuration to switch at variable frequencies to deliver desired power to the lamp 20. The control for switching the high and low side switches typically requires a somewhat sophisticated control and instruction scheme to provide the appropriate switching frequency and responsiveness to obtain the desired output. A microcontroller and specific value components are often used to supply a switch driver with the appropriate control signals to indicate such parameters as switching frequency, dead time and other desired characteristics for operating the half bridge driver switches. Cost and power considerations often dictate a need for a simple switch driver that does not require sophisticated control signals to drive the half bridge switches.

SUMMARY OF THE INVENTION

The present invention overcomes the drawbacks of the prior art by providing a simple half bridge driver integrated circuit (IC), in particular, for lighting ballast applications, that can be driven with simple microcontrollers. The half bridge driver can accept a single timed pulse from a microcontroller to operate the switches in the half bridge according to desired parameters. This simple control scheme permits a very simple or low level microcontroller to be used without the need of complicated and power consuming external logic. The driver circuit includes dead time settings to prevent both high and low side outputs from being active at the same time.

Although the invention is particularly adapted for use as a ballast controller, the invention may be used as a driver for other loads switched by a half-bridge switching circuit.

BRIEF DESCRIPTION OF THE DRAWINGS

The present invention is described in greater detail below, with reference to the drawings that have designated reference numerals, in which.

DETAILED DESCRIPTION OF PREFERRED EMBODIMENTS

Figure 1:
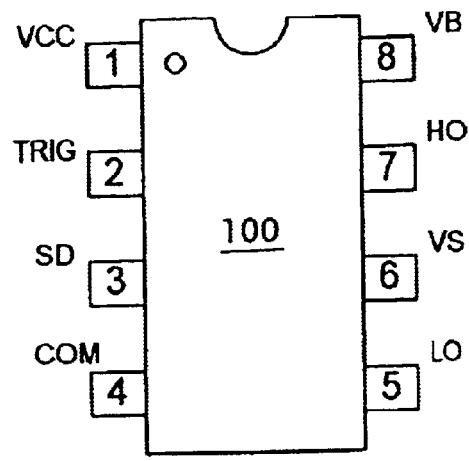
FIG. 1 is a diagram of the driver IC showing pinouts.
Figure 3:
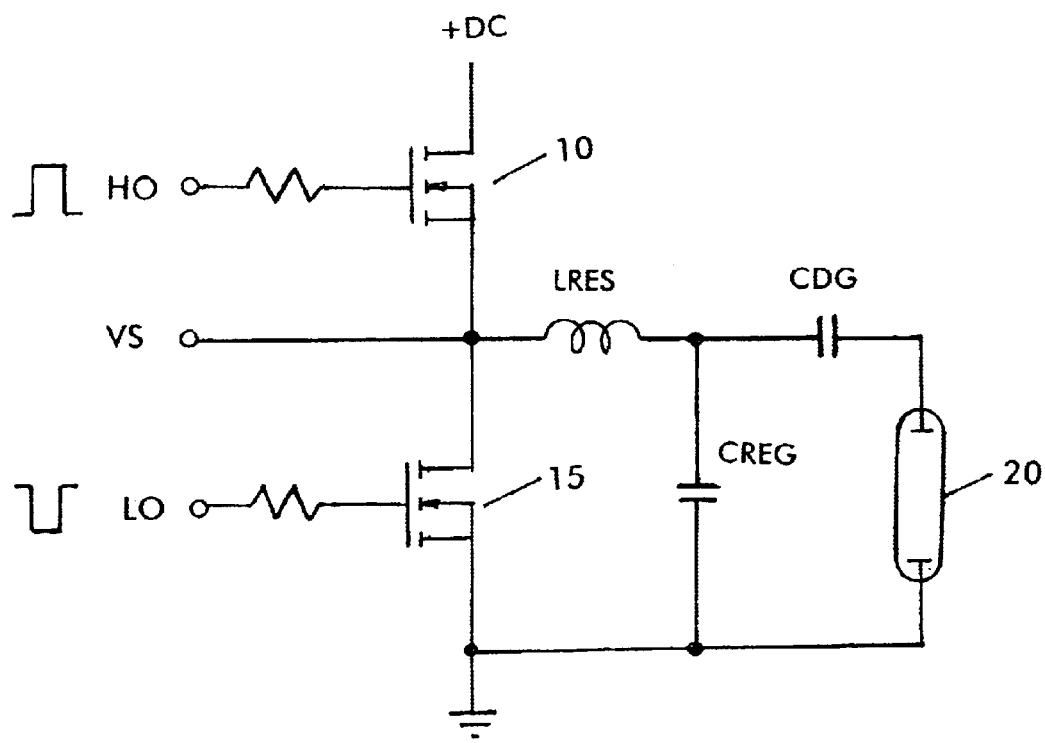
FIG. 3 shows a simplified prior art half bridge output stage for driving a lamp load.
Figure 4:
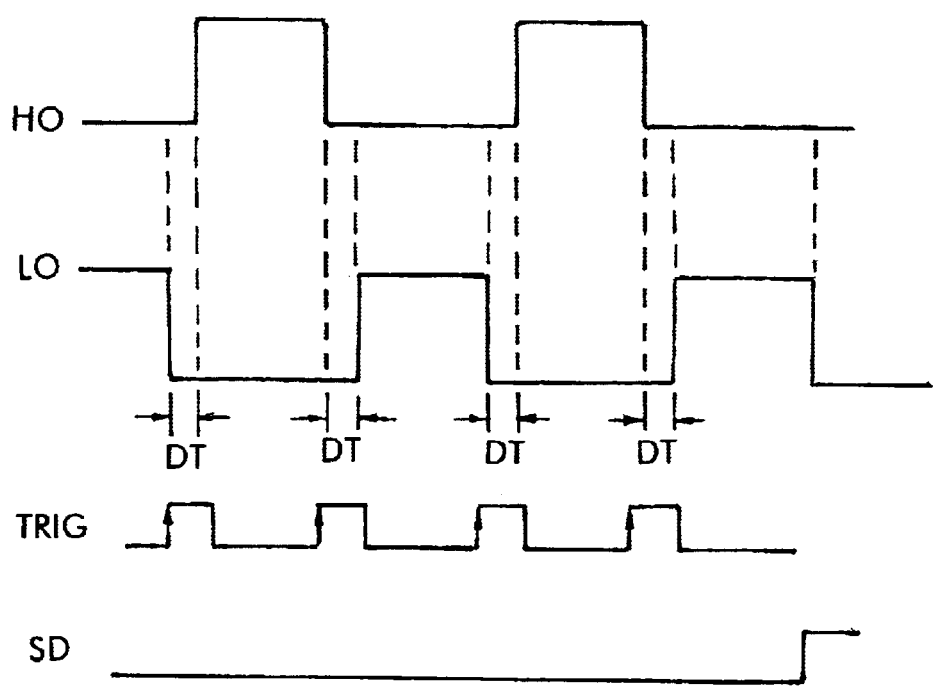
FIG. 4 shows the high and low side switch drive signals together with a microprocessor generated trigger input signal.

Referring now to FIG. 1, a driver IC according to the present invention is illustrated generally as IC 100. IC 100 includes a pin TRIG that receives a timed triggering pulse from a microcontroller or other control device to drive switch signals on pins HO and LO. Pin HO is a high side output signal for controlling a high voltage switch in the half bridge configuration, while pin LO provides switching signals for the low side switch in the half bridge. FIG. 4 shows a typical simplified half-bridge output circuit driving a gas discharge lamp load. Pin SD of IC 100 is used for controlling a disable or shutdown for the high and low side outputs. IC 100 also accepts chip power inputs on pins VCC and VB with respect to common input COM. VS is the switched output of the half bridge, as shown in FIG. 4.

Figure 2:
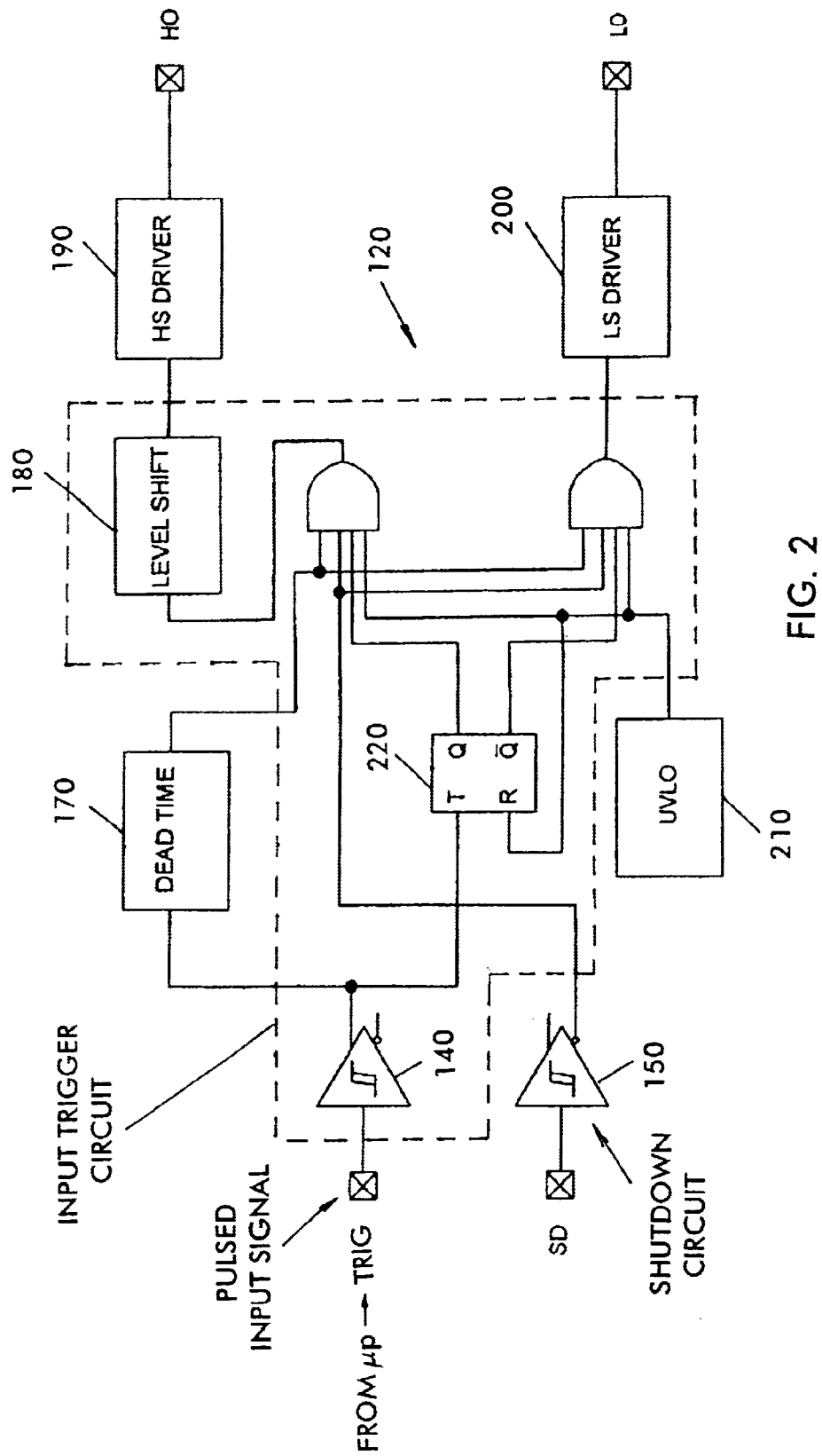
FIG. 2 is a schematic diagram of the circuit for the half bridge driver.

Referring now to FIG. 2, a circuit schematic for the half bridge driver 100 of FIG. 1 is illustrated generally as circuit 120. The TRIG and SD inputs to circuit 120 provide all the control for driving the outputs HO and LO to control operation of the half bridge. The signals on pins TRIG and SD are thresholded with devices 140, 150 before being applied to circuit 120 to produce the half bridge control. The thresholded signal from the TRIG pin is fed to a flip-flop 220 and a dead time control 170 to condition the signal for driving the high and low side outputs. Dead time control 170 disables both HO and LO outputs to prevent the outputs from both being active at the same time while the half bridge is switching. FIG. 4 shows the HO and LO signals and the dead time DT. Flip-flop 220 provides an approximately 50% duty cycle for both the high and low side outputs to the half bridge. The output for the high side output switch is scaled up with a level shift circuit 180 to a higher voltage for the high voltage switch on the high side of the half bridge. The voltage shifted output signal is fed to a high side driver 190 to be output to the high side switch of the half bridge. Similarly, a low side driver 200 provides a control signal for the lower voltage low side switch of the half bridge.

Circuit 120 provides various safety features for the ballast control including a switch disable on pin SD, and an undervoltage lockout 210. Undervoltage lockout 210 prevents damage to the circuit and the driven switches when an undervoltage condition occurs. In particular, undervoltage lockout 210 is used during turn on time to insure that the IC 100 supply voltage is stabilized before operating the outputs for the high and low side drivers for the half bridge. Once an appropriate start up voltage is reached for the IC and other components of circuit 120, undervoltage lockout 210 enables the outputs for the high and low side drivers to operate the switches in the half bridge.

The TRIG and SD inputs accept zero to five volts logic level inputs for simplified control from a microcontroller. FIG. 4 shows a typical TRIG input from the microcontroller. The frequency of the TRIG signal can be changed by the microcontroller to control the lamp settings, e.g., the dimming level. A positive going pulse on the TRIG input causes the outputs for the high and low side drivers to change state and signals the beginning of the dead time for switching. See FIG. 4. When pin SD is at a logic high level, the high and low side outputs are both disabled. See FIG. 4. Accordingly, IC 100 can easily be used in conjunction with a simple microcontroller that can drive a half bridge ballast control using a single timed output pulse. The duty cycle of the single timed output pulse is irrelevant, further simplifying the control provided by the microcontroller. Generally, a single timed output pulse can be obtained with good consistency from very simple microcontrollers through the use of internal timers or capture modules. Accordingly, no additional external logic is needed to operate the ballast control. By preventing both high and low side outputs from being high at the same time, circuit 120 provides inherent shoot-through protection.

Half bridge drivers are conventionally configured with external components that are used to set various parameters for operation of the ballast control. It is contemplated that IC 100 can incorporate internally a number of components to set parameters according to the simplified ballast control. For example, IC 100 can incorporate a boot strap diode to contribute to controlling the supply voltage for the high side driver circuitry.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A driver circuit for driving a half bridge switching circuit, the driver circuit comprising:
    an input trigger circuit receiving a pulsed input signal for controlling the generation of two drive signals, a first drive signal driving a high side switch of a half bridge switching circuit and a second drive signal driving a low side switch of the half bridge switching circuit;
    a circuit for providing a dead time between the first and second drive signals whereby both the first and second drive signals are substantially zero;
    the input trigger circuit generating a control signal for controlling the generation of the first and second drive signals based on a characteristic of the pulsed input signal;
    first and second drive circuits for providing said first and second drive signals; and wherein when the first and second drive circuits provide said first and second drive signals, the input trigger circuit is non-responsive to a pulse duration of said pulsed input signal.

2. The driver circuit of claim 1, wherein the characteristic of the pulsed input signal comprises a pulse edge of the pulsed input signal whereby when a pulse edge occurs, the first and second drive signals change state with said dead time between the drive signals.

3. The driver circuit of claim 2, wherein the characteristic comprises a rising edge.

4. The driver circuit of claim 1, further comprising a shut down circuit receiving a shut down input for disabling the generation of said first and second drive signals.

5. The driver circuit of claim 1, wherein the pulsed input signal is generated by a microprocessor.

6. The driver circuit of claim 1, further comprising a circuit for generating said first and second drive signals with approximately a 50% duty cycle.

7. The driver circuit of claim 1, further comprising an under voltage lockout circuit for preventing generation of said first and second drive signals until a supply voltage for the driver circuit has stabilized.

8. The driver circuit of claim 1, further comprising a level shifting circuit for shifting a level of a signal driving at least one of said first and second drive circuits.

9. A ballast driver circuit for driving a switching circuit driving a gas discharge lamp, the ballast driver circuit comprising:
    an input trigger circuit receiving a pulsed input signal for controlling the generation of two drive signals, a first drive signal driving a high side switch of a half bridge switching circuit and a second drive signal driving a low side switch of the half bridge switching circuit;
    a circuit for providing a dead time between the first and second drive signals whereby both the first and second drive signals are substantially zero;
    the input trigger circuit generating a control signal for controlling the generation of the first and second drive signals based on a characteristic of the pulsed input signal;
    first and second drive circuits for providing said first and second drive signals; and wherein when the first and second drive circuits provide said first and second drive signals, the input trigger circuit is non-responsive to a pulse duration of said pulsed input signal.

10. The ballast driver circuit of claim 9, wherein the characteristic of the pulsed input signal comprises a pulse edge of the pulsed input signal whereby when a pulse edge occurs, the first and second drive signals change state with said dead time between the drive signals.

11. The ballast driver circuit of claim 10, wherein the characteristic comprises a rising edge.

12. The ballast driver circuit of claim 9, further comprising a shut down circuit receiving a shut down input for disabling the generation of said first and second drive signals.

13. The ballast driver circuit of claim 9, wherein the pulsed signal is generated by a microprocessor.

14. The ballast driver circuit of claim 9, further comprising a circuit for generating said first and second drive signals with approximately a 50% duty cycle.

15. The ballast driver circuit of claim 9, further comprising an under voltage lockout circuit for preventing generation of said first and second drive signals until the supply voltage for the ballast driver circuit has stabilized.

16. The ballast driver circuit of claim 9, further comprising a level shifting circuit for shifting a level of a signal driving at least one of said first and second drive circuits.

17. A method for driving a half-bridge switching circuit comprising:
    receiving a single pulsed input signal for controlling the generation of two drive signals, a first drive signal driving a high side switch of a half bridge switching circuit and a second drive signal driving a low side switch of the half bridge switching circuit;
    providing a dead time between the first and second drive signals whereby both the first and second drive signals are substantially zero;
    generating a control signal for controlling the generation of the first and second drive signals based on a characteristic of the pulsed input signal;
    generating the first and second drive signals; and wherein when the first and second drive signals are generated, the input trigger circuit is non-responsive to a pulse duration of said pulsed input signal.

18. The method of claim 17, wherein the step of generating a control signal comprises generating the control signal based on the location in time of a pulse edge of the pulsed input signal whereby when a pulse edge occurs, the first and second drive signals change state with said dead time between the drive signals.

19. The method of claim 18, wherein the characteristic comprises a rising edge.

20. The method of claim 17, further comprising using said first and second drive signals to control the half bridge switching circuit to control operation of a gas discharge lamp.

21. The method of claim 17, further comprising providing a shut down signal to disable the generation of the first and second drive signals.

22. The method of claim 17, further comprising generating the pulsed input signal from a microprocessor.

23. The method of claim 17, further comprising generating the first and second drive signals with approximately a 50% duty cycle.

24. The method of claim 17, further comprising generating an under voltage lockout signal for preventing generation of said first and second drive signals until the supply voltage for the driver circuit has stabilized.

25. The method of claim 17, further comprising shifting a level of said control signal prior to generating at least one of said first and second drive signals.

* * * * *